United States Patent [19]

Murakami et al.

[11] Patent Number: 5,329,173
[45] Date of Patent: Jul. 12, 1994

[54] SIGNAL DETECTING CIRCUIT APPARATUS

[75] Inventors: Daisuke Murakami; Kenji Kibayashi; Isao Matsumoto; Hideki Yoshida; Mitsuaki Nishie; Satoshi Takahashi; Katsumi Uesaka, all of Kanagawa, Japan

[73] Assignee: Sony Corporation, Tokyo, Japan

[21] Appl. No.: 37,646

[22] Filed: Mar. 26, 1993

[30] Foreign Application Priority Data

Mar. 31, 1992 [JP] Japan .................. 4-106006

[51] Int. Cl.$^5$ .................. H03K 5/22; H03K 5/153
[52] U.S. Cl. .................. 307/355; 307/362; 307/311; 307/290; 307/359; 307/491; 307/494
[58] Field of Search .............. 307/362, 311, 290, 355, 307/358-359, 491, 494

[56] References Cited

U.S. PATENT DOCUMENTS 5,204,560  4/1993  Bredin et al. .................. 307/290

Primary Examiner—Margaret Rose Wambach
Attorney, Agent, or Firm—Hill, Steadman & Simpson

[57] ABSTRACT

A signal detecting apparatus is to obtain hysteresis characteristic at a constant ratio regardless of signal amplitude fluctuations by supplying the threshold level adjusting signal corresponding to the input signal amplitude to the comparison circuit. The threshold value setting signal and the hysteresis adjusting signal is supplied to a comparison circuit through an amplifier and a hysteresis adjusting means having the identical characteristic with the peak hold circuit to set a threshold value and a hysteresis range. Therefore even in the case where the operating characteristic of the amplifier and the peak hold circuit for detecting the peak level of signal amplitude fluctuate, the threshold value and the hysteresis range fluctuation corresponding to the fluctuation. As a result, there can not need the adjustment for resetting the operating characteristic, the threshold value and the hysteresis range in each circuit and thus the time and labor required for adjustment can be further saved.

5 Claims, 6 Drawing Sheets

SIGNAL DETECTING CIRCUIT APPARATUS

FIELD OF THE INVENTION

This invention relates to a signal detecting circuit apparatus, and is applicable to a signal input judging device and its comparison circuit for judging the existence of an optical input to be inputted via an optical fiber, for example.

BACKGROUND OF THE INVENTION

Heretofore, as shown in FIG. 1, in the optical fiber transmission system 1 which is transmitted via optical fiber, the transmitting data is reproduced from receiving signals received via the optical fiber.

More specifically, when an optical input S1 transmitted via the optical fiber is received at a photodiode 2 for example, which converts it into an input signal S2 to be supplied to a current/voltage converting circuit 3.

An input voltage signal S3 converted into voltage by the current/voltage convertor is supplied to an optical input receiving unit 4, in-which the voltage signal S3 is amplified by a main amplifier 5 so as to reproduce the transmission data based on the received signal S4 obtained therefrom.

Thus, in the optical fiber transmission system 1, the transmission data is reproduced from the received signal S4 outputted from the main amplifier 5, but also the received signal S4 is supplied to an alarm signal generation circuit 6 to judge whether the optical input S1 to be inputted exists or not.

In the alarm signal generation circuit 6, the received signal S4 is inputted to a peak hold circuit 7 to detect the peak level and the detection result is supplied to a comparison circuit 8. Then the comparison circuit 8 judges whether the optical input S1 is inputted or not depending on the comparison result between the peak level detection signal S5 inputted from the peak hold circuit 7 and the reference voltage, and outputs an alarm signal S6.

For example, in the case where the signal level of the received signal S4 drops when the optical fiber is disconnected from the connector, the comparison circuit 8 judges that the optical input S1 is not inputted and then the peak level is lower than the reference voltage, so as to make the logical value of the alarm signal S6 rise to an "H" level which is outputted to the peripheral device.

Since there is a possibility that noises which are generated in the preprocessing circuits (i.e., photodiode 2, current/voltage converter 3, etc.) may be mixed in the peak level detection signal S5 that is inputted to a comparison circuit 8, the hysteresis characteristic is provided in the comparison circuit 8 and the hysteresis range is adjustable by the hysteresis adjusting signal S7.

Furthermore, since the dynamic range of the peak level detection signal S5 that is inputted to the comparison circuit 8 fluctuates approximately ten times depending on the type of the photodiode 2 (e.g., avalanche photodiode and pin photodiode) and the difference in gain of the current/voltage $V_{ref}$ as shown in FIGS. 2A and 2B converter 3, the reference voltage can be also adjusted by changing the threshold level setting signal S8.

However, in the case of the optical fiber transmission system 1, whenever the input level of the receiving signal S4 fluctuates dye to the combination of circuit elements used in the preprocessing circuits and the variations in their operating characteristics and the operating temperature, the hysteresis range and the reference voltage must be adjusted by the hysteresis adjusting signal S7 which is inputted from the adjusting terminal and by the threshold level setting signal S8. Therefore, a great deal of labor is required for adjustment of the signals.

Furthermore, as shown in FIG. 3, a conventional hysteresis variable type comparison circuit 8 generates a voltage in proportion to the hysteresis by providing comparison outputs $V_{OUT1}$ and $V_{OUT2}$ to be outputted from the differential input stage constituted by a pair of NPN-type transistors Q1 and Q2 through buffer transistors Q3 and Q4 to the base of transistors Q5 and Q6 so as to feedback the offset current corresponding to the comparison outputs VOUT1 and $V_{OUT2}$ to load resistances R1 and R2 (in which the resistance values are both R).

More specifically, in the comparison circuit 8, the hysteresis range (R×I2) can be adjusted by adjusting a current I2 being carried through the current source 9 connected to the common emitter of the transistors Q5 and Q6 which constitute the latch circuit.

However, in this type of comparison circuit 8, since the current I2 decreases at a fixed ratio and the gain of the latch circuit also decreases as the input amplitude decreases if hysteresis changes at a constant ratio to the input amplitude at, in the case where the input amplitude is small and the signal level of the receiving signal S4 is near to the reference voltage there occurs problems that the transistors Q5 and Q6 do not perform their switching function, hysteresis does not function properly and the input dynamic range comes narrow.

SUMMARY OF THE INVENTION

In view of the foregoing, an object of this invention is to provide a signal detecting circuit apparatus capable of making the input dynamic range wider than the prior device as well as canceling the necessity of fine adjustment of the reference voltage and hysteresis range to proper values corresponding to the system construction of an optical fiber transmission system.

According to the present invention, the threshold value adjusting signal and the hysteresis adjusting signal corresponding to the threshold value adjusting signal are supplied to the comparison means through the hysteresis adjusting means having the identical characteristic with the amplifier and the peak-hold circuit. This enables the variations in the circuit elements which compose the amplifier and the peak-hold circuit and the fluctuation of operating temperature of each circuit to be canceled, whereby the adjustment of the operating characteristic, the threshold value and hysteresis range of each circuit which are ordinarily required each time that the operating temperature and other factors fluctuate becomes unnecessary.

Furthermore, a comparison output of the comparison unit is converted into 2-valued (binary) data which is then multiplied by the hysteresis adjusting signal, and the multiplied result corresponding to the hysteresis range is fed back to the comparison unit as an offset voltage, so that the problems in the prior art that the hysteresis operation becomes unstable in the case where the signal level of the input signal is small, can be effectively avoided, so that the input dynamic range can be made wider.

The nature, principles and utility of the invention will become more apparent from the following detailed description when read in conjunction with the accompanying drawings in which like parts are designated by like reference numerals or characters.

DETAILED DESCRIPTION OF THE INVENTION

Figure 4:
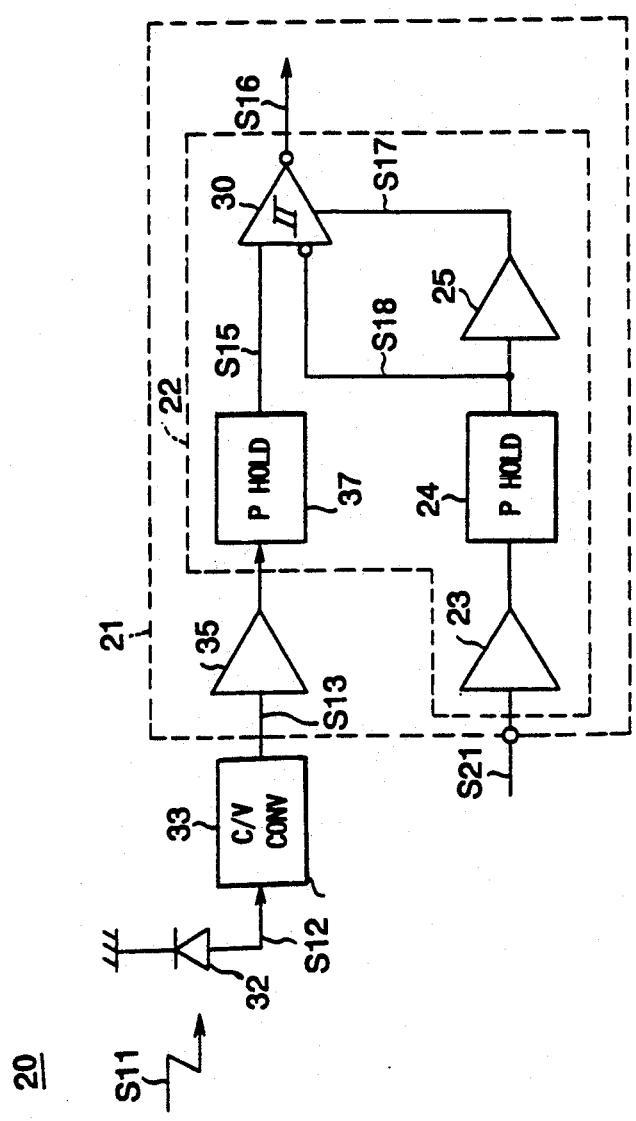
FIG. 4 is a block diagram illustrating a first embodiment of the signal detecting circuit according to this invention.

Preferred embodiments of this invention will be described with reference to the accompanying drawings:

FIG. 4 denotes one embodiment of the present invention. Element 20 generally shows an optical fiber transmission system.

In the optical fiber transmission system 1, a photodiode 32 receives an optical input S11 which it converts into an input current signal S12, and the input current signal S12 is then converted into an input voltage signal S13 in a current to voltage converting circuit 33 so as to input the input voltage signal S13 to a peak hold circuit 37 of an alarm signal generation circuit 22 through a main amplifier 35 of an optical input receiving unit 21.

The alarm signal generation circuit 21 comprises a threshold level setting amplifier 23 and a peak hold circuit 24. The threshold level setting amplifier 23 amplifies the alarm signal setting signal S21 to supply it to the peak hold circuit 24, a peak hold voltage of which is supplied to a comparison circuit 30 as a threshold level setting signal S18.

Moreover, the threshold level setting signal S18 is supplied to the comparison circuit 30 through the hysteresis adjusting amplifier 25 as a hysteresis adjusting signal S17, so that the hysteresis range of the comparison circuit 30 can be set in proportion to the input amplitude.

Next, the construction of the comparison circuit 30 of this embodiment will be described with FIG. 5 in detail.

The comparison circuit 30 which is composed of a comparison unit 41, a latch unit 42 and a multiplying unit 43, is to convert comparison outputs S31 and S32 of the comparison unit 41 into digital signals D31 and D32 in the latch unit 42 and to output as alarm signal S16 and inverse alarm signal S16I.

The comparison unit 41 inputs a peak hold voltage S15 and a threshold level setting signal S18 as shown in FIG. 4 to transistors Q31 and Q32 composed of a differential pair, and outputs inverse comparison output S31 and an in-phase comparison output S32 from connecting nodes P31 and P32 of load resistances R31 and R32 connected to the collectors.

Here, the other ends of the load resistances R31 and R32 are connected to the connecting nodes P33 and P34 of buffer transistors Q33 and Q34 and current sources 55 and 56, so that offset signals V31 and V32 are fed back through the buffer transistors Q33 and Q34.

With this arrangement, an offset arises corresponding to the hysteresis adjusting voltage relative to the reference potential $V_{CC}$ at connecting nodes P33 and P34, and even in the case where the peak hold voltage S15 which is almost equal to the threshold level setting signal S18 is inputted, the comparison circuit 30 acts in the normal hysteresis function.

The comparison unit 41 outputs an inverse comparison output signal S31 and an in-phase comparison output signal S32 to the latch unit 42 of the following stage through buffer transistors Q35 and Q36.

In this connection, the common emitter for transistors Q31 and Q32 and emitters of the buffer transistors Q35 and Q36 are respectively connected to the current sources 57, 58 and 59.

The latch unit 42 sequentially outputs an in-phase comparison output signal S32 and an inverse comparison output signal S31 through an amplifier 60 and a R-S flip flop circuit 61 and converts the inverse comparison output signal S31 and the in-phase comparison output signal S32 which are analog outputs, into digital output signals D31 and D32 so as to output them to the multiplying unit 43 as Q output and IQ (inverse Q) output signals.

The multiplying unit 43 is composed of transistors Q37 and Q38, and Q39 and Q40 which form differential pairs respectively, and transistors Q41 and Q42 connected to the differential pairs to form a multiplying circuit.

Emitters of the transistors Q41 and Q42 are connected to each other through an input resistance R34.

Also, the Q output and the IQ output are inputted to the base of the transistors Q37 and Q38, and Q39 and Q40 respectively, and hysteresis adjusting signals S17I and S17 to be inputted to the transistors Q41 and Q42 are multiplied.

With this arrangement, the multiplying unit 43 generates a difference voltage corresponding to the hysteresis range to load resistances R35 and R36 connected to the common collector with transistors Q38 and Q39, Q37 and Q40 to be given reverse logical output to each other so as to feedback to the comparison unit 41 as offset voltages V32 and V31.

The comparison circuit 30 turns off transistors Q37 and Q39 of the multiplying unit 43 and on the other hand, operates transistors Q38 and Q40, in the case where peak-hold voltage $V_{REF}+V_{AV}$ which is almost equivalent to the voltage level $V_{REF}$ of threshold level setting signal S18 is inputted and Q output and IQ output of the latch unit 42 are logic "L" and logic "H" respectively.

At this point, if the difference of voltages $V_{S17}$ and $V_{S17I}$ ($V_{S17}>V_{S17I}$) of hysteresis adjusting signals S17I and S17 to be supplied to transistors Q41 and Q42 is $V_{CONT}$, the transistors Q41 and Q42 produce the current difference as given by the following equations:

$$I13 = I12 - V_{CONT}/R34 \quad (1)$$

$$I14 = I12 + V_{CONT}/R34 \quad (2)$$

Here, voltages of the load resistances R35 and R36 drop respectively as expressed in the following equations:

$$V_{CC} - V32 = I13 \times R \quad (3)$$

$$V_{CC} - V31 = I14 \times R \quad (4)$$

(however, R35 = R36 = R)

and between voltages V31 and V32, the offset voltage corresponding to the hysteresis control voltage is produced as expressed in the following equation:

$$\begin{aligned} V32 - V31 &= (I14 - I13) \times R \\ &= 2 \times V_{CONT} \times \frac{R}{R34} \end{aligned} \quad (5)$$

As a result, the offset voltage corresponding to the hysteresis control voltage $V_{CONT}$ is fed back to the comparison unit 41 regardless of the input signal amplitude. Therefore, the troubles that hysteresis becomes unstable and the input dynamic range becomes narrow when the input amplitude is small, can be effectively avoided.

Accordingly, the comparison circuit 30 is able to generate the hysteresis range with the prescribed ratio even if the input amplitude is either large or small and thus the hysteresis variable type comparison circuit having wide input dynamic range can be obtained.

According to the foregoing construction, in the case where the combination of types of diode elements to be used as a photodiode 32 and the gain of a current/voltage converter 33 fluctuates the user may input the alarm signal setting voltage S21 corresponding to the combination to an alarm signal generation circuit 21 from the external terminal, and then the threshold level $V_{REF}$ of the comparison circuit 30 and hysteresis range are set at once by inputting the alarm signal setting voltage S21.

Figure 1:
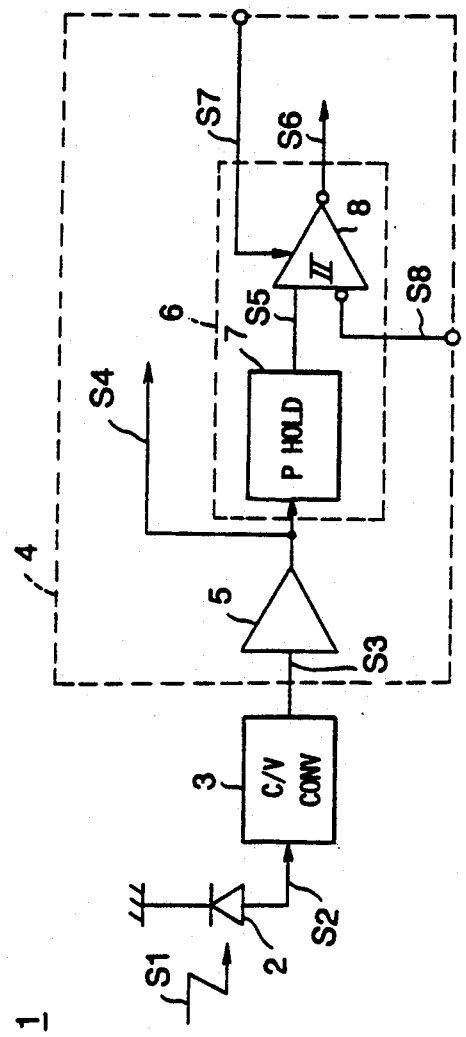
FIG. 1 is a block diagram illustrating the conventional signal judging circuit.
Figure 2A:
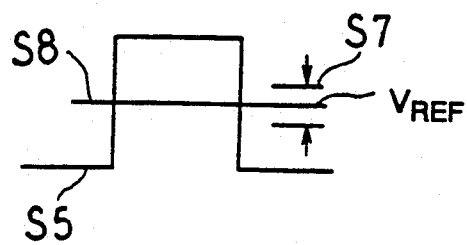
FIGS. 2A and 2B are signal waveform diagrams showing a operating characteristic of the signal judging circuit shown in FIG. 1.
Figure 2B:
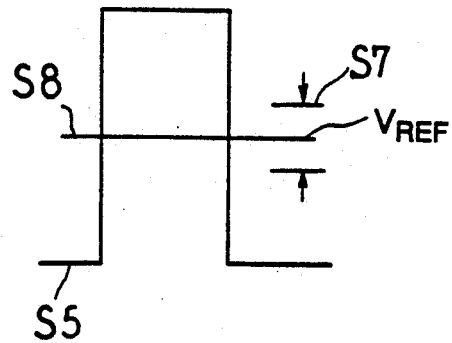

In FIG. 4, since the threshold level setting amplifier 23 and the peak hold circuit 24 are composed of the identical construction with the conventional block of main amplifier shown in FIG. 1 and the peak hold circuit. That is, in the case where the application conditions (operating temperature, current source voltage and the amount of variation of operating characteristic during the manufacturing process) of the main amplifier 23 and the peak hold circuit 24 in which the receiving signal S21 is inputted, fluctuate and in the case where the gain fluctuates, the hysteresis adjusting voltage S17 and threshold level setting voltage S18 are increased and decreased according to the fluctuations.

Accordingly, in the case where the application condition of the alarm signal generation circuit 21 fluctuates, the comparison circuit 30 also can perform the comparison function with an appropriate threshold level and hysteresis range of the fixed ratio given at the time of setting, and the necessity of re-adjustment depending on the operating condition of each circuit element which was required before whenever the application condition changes can be avoided.

According to the foregoing construction, there is provided the threshold level setting amplifier 23 and the peak hold circuit 24 having the identical construction with the main amplifier 35 and the peak hold circuit 37 which supply the voltage signal S13 converted from the optical input S11 to the comparison circuit 30, and the hysteresis adjusting voltage S17 corresponding to the input amplitude is supplied via the threshold level setting amplifier 23 and the peak hold circuit 24, so that the constant hysteresis function can be obtained in the comparison circuit 30 regardless of the application condition and the combination of circuit elements.

A modification of the above embodiment of the present invention will be described.

The embodiment discussed above has dealt with the case of supplying the hysteresis adjusting signal S17 and threshold level setting signal S18 to the comparison circuit 30 passing sequentially through the threshold level setting amplifier 23 and the peak hold circuit 24. However, the present invention is not limited to the above, but also the output of threshold level setting amplifier 23 may be supplied directly to the comparison circuit 30.

Furthermore, the embodiment discussed above has dealt with the case of amplifying the threshold level setting signal S18 at the hysteresis adjusting amplifier 25 and supplying to the comparison circuit 30 as the hysteresis adjusting signal S17. The present invention is not, however, only limited to this, but also it is applicable to the case of supplying the threshold level setting signal S18 directly to the comparison circuit 30 as the hysteresis adjusting voltage S17.

Figure 6:
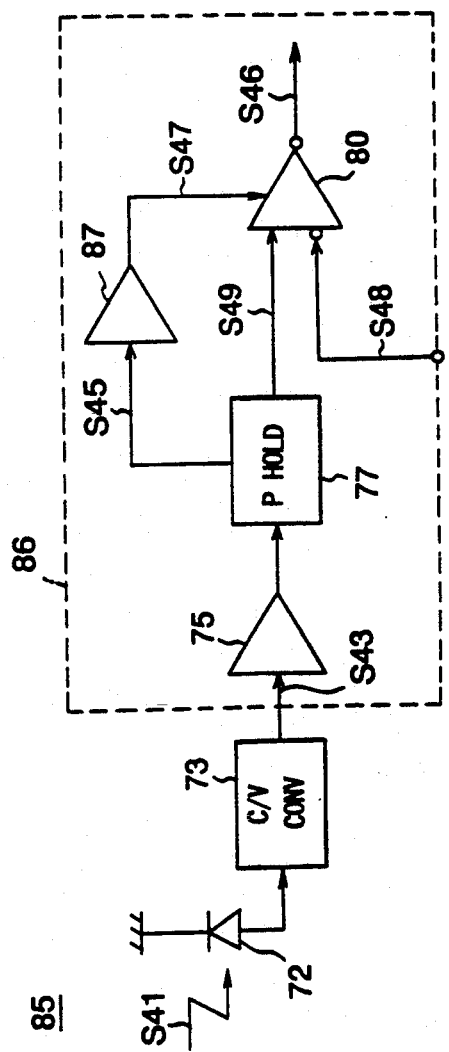
FIG. 6 is a block diagram illustrating another embodiment of the signal detecting circuit.

Furthermore, the embodiment discussed above has dealt with the case of forming the hysteresis adjusting signal S17 depending upon the alarm signal setting signal S21. The present invention is not, however, limited to this, but also the peak level of the optical input S41 may be amplified via the amplifier 87 as shown in FIG. 6 and it may be treated as the hysteresis adjusting voltage S47.

With this arrangement, the optical fiber transmission system 85 can apply hysteresis to the optical input S41 with a wide input dynamic range and at the fixed ratio constantly.

Figure 5:
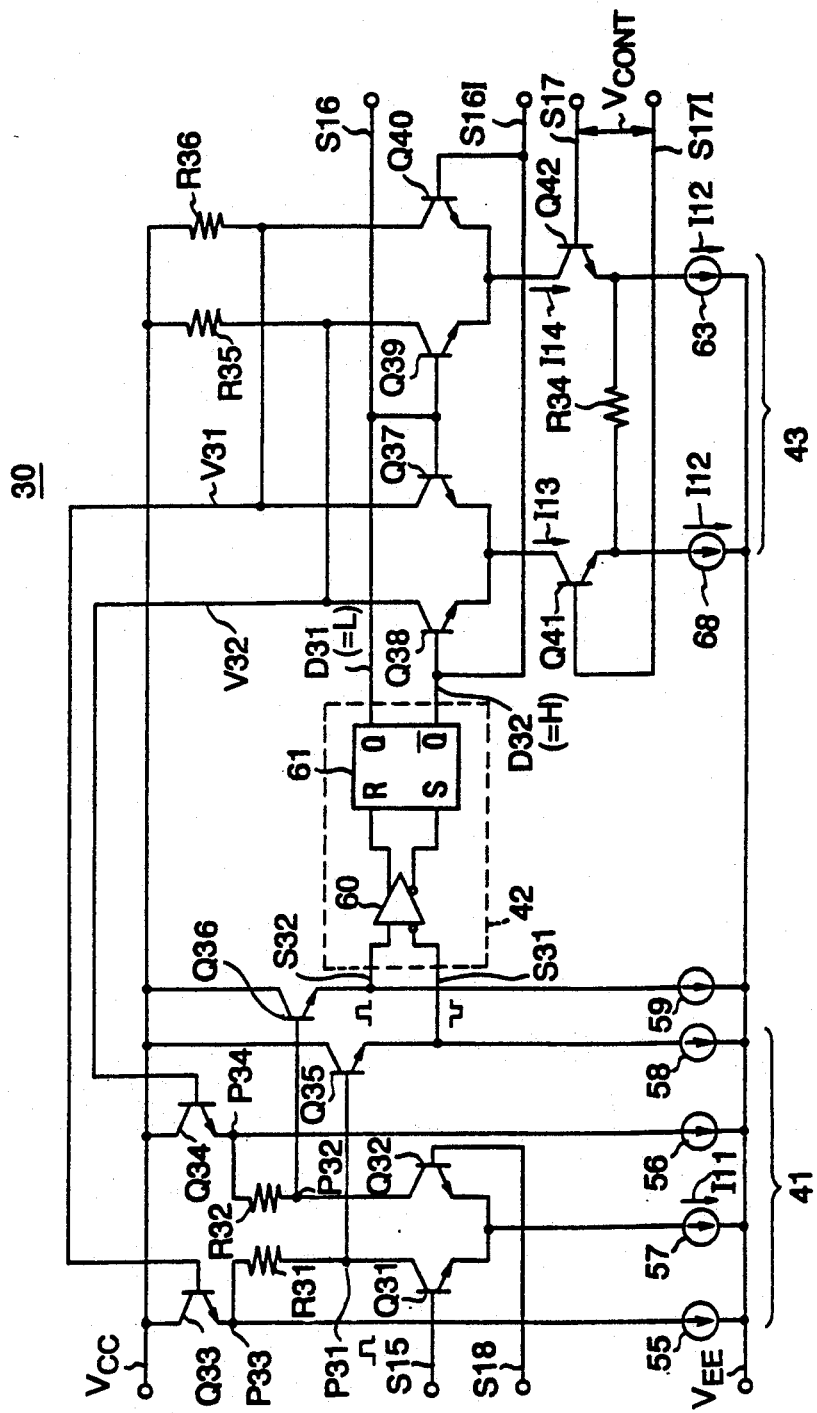
FIG. 5 is an equivalent circuit diagram illustrating the comparison circuit to be used in the signal detecting circuit shown in FIG. 4.

Moreover, the embodiment shown in FIG. 5 discussed above has dealt with the case of constituting the latch unit 42 of the comparison circuit 30 by amplifiers 60 and 61. However, the present invention is not only limited to this, but also the D-latch may be used and also it is widely applicable to the case where utilizing the high gain limiter amplifier without latch function.

Figure 3:
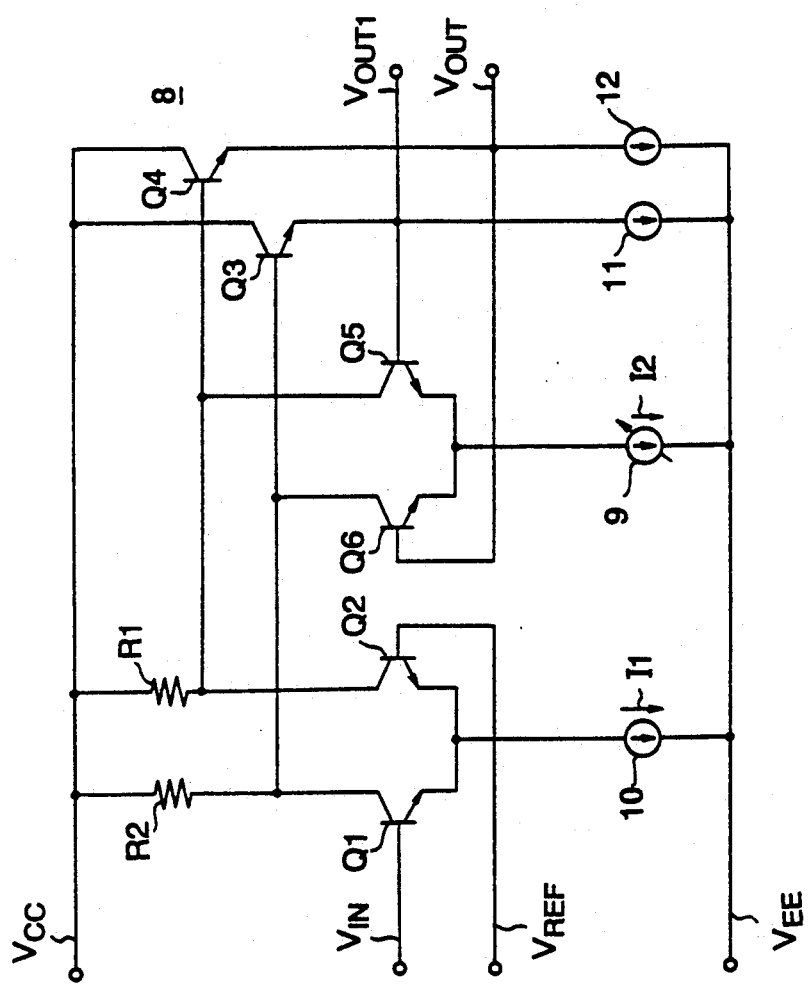
FIG. 3 is an equivalent circuit diagram illustrating the conventional comparison circuit to be used in the signal judging circuit shown in FIG. 1.

Furthermore, the embodiment discussed above has dealt with the case of utilizing the comparison circuit 30 as the hysteresis variable type comparison circuit. However, the present invention is not only limited to this, but also it is applicable to the case of utilizing the conventional comparison circuit 8 shown in FIG. 3.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A signal input judging apparatus for judging an input of input signal to a receiver by inputting a peak level of receiving signals sequentially detected via an amplifier and a peak hold circuit to a comparison means and by outputting a comparison result of said peak level and a threshold value as a signal input detection signal, comprising:

hysteresis adjusting means for supplying a predetermined level to said comparison means as a threshold value adjusting signal, and simultaneously supplying a hysteresis adjusting signal corresponding to said threshold value adjusting signal, and for setting a reference signal level of said threshold value and hysteresis range: wherein;

said hysteresis adjusting means have an identical characteristic with said amplifier and peak hold circuit.

2. A signal input judging apparatus for judging an input of input signal to a receiver by inputting a peak level of receiving signals sequentially detected via an amplifier and a peak hold circuit to a comparison means and by outputting a comparison result of said peak level and a threshold value as a signal input detection signal, comprising:

hysteresis adjusting means for supplying an amplified reference level setting signal to said comparison means as a threshold value adjusting signal, and simultaneously supplying a hysteresis adjusting signal corresponding to said threshold value adjusting signal and for setting a reference signal level of said threshold value and hysteresis range: wherein;

said hysteresis adjusting means have an identical characteristic with said amplifier and peak hold circuit.

3. The signal input judging apparatus of claim 1, wherein said comparison means comprises:

a comparison unit for comparing said peak level and said threshold value and outputting the comparison result as a comparison output;

a latch unit for outputting said comparison output after converting into binary data; and a multiplying unit for adjusting a hysteresis range of said threshold value by outputting said binary data as a signal input detection signal and simultaneously multiplying said binary data by said hysteresis adjusting signal and feeding back a multiplication result to said comparison unit.

4. A comparison apparatus, comprising:

a comparison unit for comparing an inputted signal level and a threshold value and outputting a comparison result as a comparison output;

a latch unit for outputting said comparison output after converting into binary data; and a multiplying unit for adjusting a hysteresis range of said threshold value by outputting said binary data as a comparison output signal and simultaneously multiplying said binary data by a hysteresis adjusting signal and feeding back a multiplication result to said comparison unit.

5. The signal input judging apparatus of claim 2, further comprising:

an amplifier being identical with a main amplifier for reference level setting signal.

* * * * *

UNITED STATES PATENT AND TRADEMARK OFFICE
CERTIFICATE OF CORRECTION

PATENT NO. : 5,329,173
DATED : July 12, 1994
INVENTOR(S) : Daisuke Murakami et al.

It is certified that error appears in the above-identified patent and that said Letters Patent is hereby corrected as shown below:

Title page,
Item [73], Assignee, "Sony Corporation, Tokyo (JP)" should be
-- Sony Corporation, Tokyo (JP) and Sumitomo Electric Industries, Ltd. (JP) --

Signed and Sealed this

Twelfth Day of October, 2004

JON W. DUDAS
*Director of the United States Patent and Trademark Office*